(12) United States Patent
Hong et al.

(10) Patent No.: US 12,731,956 B2
(45) Date of Patent: Sep. 8, 2026

(54) NANOCRYSTAL ARRAY, LASER DEVICE, AND DISPLAY DEVICE

(71) Applicant: HON HAI PRECISION INDUSTRY CO., LTD., New Taipei (TW)

(72) Inventors: Kuo-Bin Hong, New Taipei (TW); Shih-Chen Chen, New Taipei (TW); Chun-Yen Peng, New Taipei (TW); Hao-Chung Kuo, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 704 days.

(21) Appl. No.: 18/195,338

(22) Filed: May 9, 2023

(65) Prior Publication Data

US 2023/0369828 A1 Nov. 16, 2023

(30) Foreign Application Priority Data

May 10, 2022 (TW) ................................. 111117547

(51) Int. Cl.

| | |
|---|---|
| ***H01S 5/026*** | (2006.01) |
| ***H01S 5/02*** | (2006.01) |
| ***H01S 5/042*** | (2006.01) |
| ***H01S 5/10*** | (2021.01) |
| ***H01S 5/34*** | (2006.01) |
| ***H01S 5/343*** | (2006.01) |

(Continued)

(52) U.S. Cl.

CPC ............ *H01S 5/0261* (2013.01); *H01S 5/021* (2013.01); *H01S 5/04256* (2019.08); *H01S 5/1042* (2013.01); *H01S 5/341* (2013.01); *H01S 5/34333* (2013.01); *H10H 20/813* (2025.01); *H10H 20/8132* (2025.01); *H10H 20/818* (2025.01)

(58) Field of Classification Search

CPC ............ H10H 20/813; H10H 20/8132; H10H 20/818; H01S 5/1042; H01S 5/0261; H01S 5/341; H01S 5/021

See application file for complete search history.

(56) References Cited

U.S. PATENT DOCUMENTS

2001/0011730 A1* 8/2001 Saeki .................. H01S 5/04253 257/79
2009/0321738 A1* 12/2009 Kim ....................... B82Y 10/00 257/E33.001

(Continued)

OTHER PUBLICATIONS

Krishnamoorthy et al., Low resistance GaN/InGaN/GaN tunnel junctions, Applied Physics Letters, vol. 102, 113503 (Mar. 2013) (Year: 2013).*

*Primary Examiner* — James A Menefee
(74) *Attorney, Agent, or Firm* — ScienBiziP, P.C.

(57) ABSTRACT

A nanocrystal array, a laser device, and a display device are provided. The nanocrystal array includes a plurality of nanorods arranged in an array. Each nanorod includes a nanorod buffer layer, a first type semiconductor layer, a tunnel junction layer, a second type semiconductor layer, a multi-quantum well, and another first type semiconductor layer successively stacked on each other. The laser device and the display device include the nanocrystal array. The present disclosure may reduce the laser threshold and increase output power, and further improve the resolution and image quality of the display device.

14 Claims, 23 Drawing Sheets

(51) Int. Cl.
*H10H 20/813* (2025.01)
*H10H 20/818* (2025.01)

(56) References Cited

U.S. PATENT DOCUMENTS

2021/0280740 A1* 9/2021 Akatsuka ............. H10H 20/813
2022/0200233 A1* 6/2022 Noda ........................ H01S 5/34

* cited by examiner

NANOCRYSTAL ARRAY, LASER DEVICE, AND DISPLAY DEVICE

FIELD

The subject matter herein generally relates to laser devices, and more particularly, to a nanocrystal array, a laser device, and a display device.

BACKGROUND

Micro light emitting diodes (micro-LEDs) based on group III nitrides are essential components of micro displays such as smartwatches, smartphones, augmented reality (AR), and virtual reality (VR). The micro-LED used in the AR/VR micro display needs to have high brightness, high resolution rate, and high refresh rate, which allows such near-to-eye device to achieve an immersive effect. However, the micro-LED is manufactured by an etching process, which may cause damages to a surface of the micro-LED is easily damaged. Thus, the non-radiative recombination is increased, and the luminous efficiency of the micro-LED is reduced. Such problems become more serious when the size of the micro-LED decreases. In addition, the micro-LED used in the AR/VR micro display also needs to have small dimensions, ultra-high image solutions, narrow pixel spacing, and small vertical beam divergence angle. However, due to the wide divergence angle of the micro-LED, the pixel spacing is difficult to be reduced, which cannot meet the requirements of the AR/VR micro display.

At present, laser components, such as vertical cavity surface emitter lasers (VCSELs) based on group III nitrides, are used to solve the above problems of micro-LED. The VCSEL device has low threshold current, circular spot, small beam divergence angle (about 10 to 15 degrees), and may be used to manufacture a two-dimensional array component. Therefore, the VCSEL can meet the requirements of the micro displays.

However, a laser resonant cavity of the traditional group III nitride VCSEL needs a Distributed Bragg Reflection (DBR) to achieve high reflectivity. The DBR may be made of epitaxial semiconductor (such as GaN/AlGaN). Although such group III nitrides can provide high reflectivity, they are also materials with high impedance material that may result in high threshold voltage and low current conductivity. In addition, the group III nitrides may also generate polarization field and lattice dislocation, which reduce the quality of the crystal structure.

Therefore, there is room for improvement in the art.

DETAILED DESCRIPTION

Implementations of the disclosure will now be described, by way of embodiments only, with reference to the drawings. The described embodiments are only some embodiments of the present disclosure, rather than all the embodiments. The disclosure is illustrative only, and changes may be made in the detail within the principles of the present disclosure. It will, therefore, be appreciated that the embodiments may be modified within the scope of the claims.

It is hereby noted that an element referred to herein as "fixed to" another element may directly exist on the other element, or may be fixed to the other element through one or more intermediate elements. An element referred to herein as "connected to" another element may be connected to the other element directly or through one or more intermediate elements. The terms "vertical", "horizontal", "left", "right", "in", "out" and other similar expressions used herein are merely for ease of description.

The term "comprising," when utilized, means "including, but not necessarily limited to"; it specifically indicates open-ended inclusion or membership in the so-described combination, group, series, and the like.

Unless otherwise defined, all technical and scientific terms used herein have the same meanings as what is generally understood by a person skilled in the technical field of this application. The terms used in the specification of this application are merely intended to describe specific embodiments but not to limit this application. The term "and/or" used herein is intended to include any and all combinations of one or more related items preceding and following the term.

Figure 1:
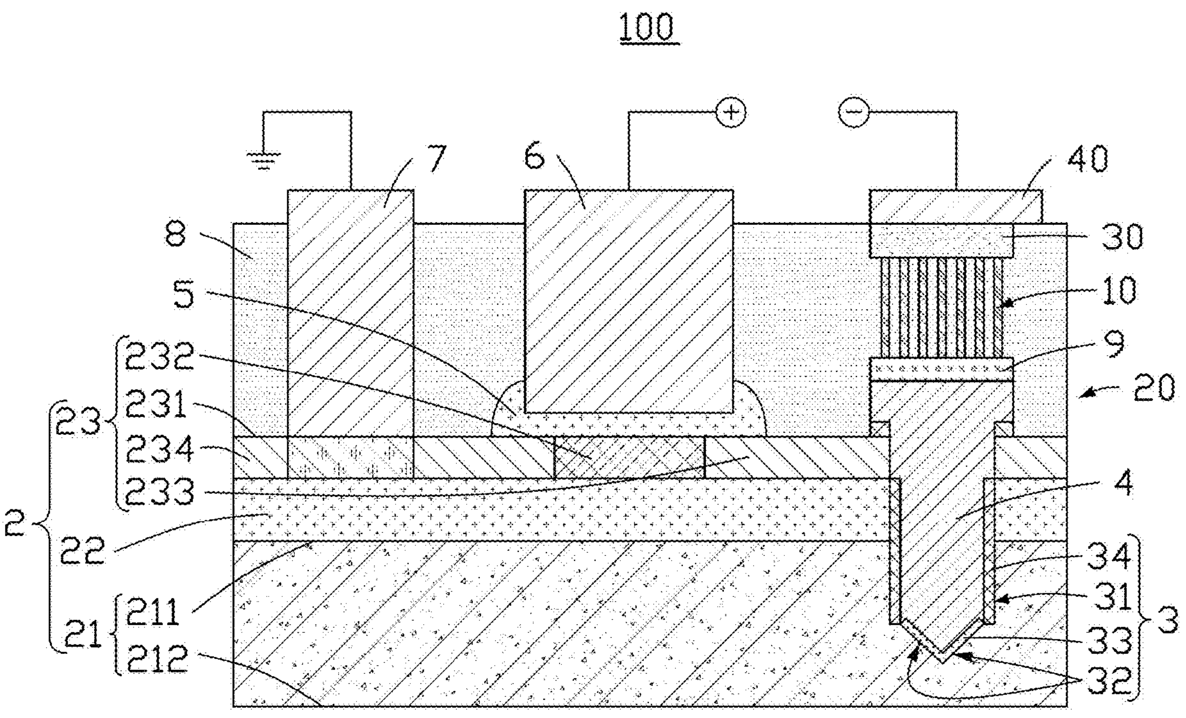
FIG. 1 is a cross-sectional view of a laser device according to an embodiment of the present disclosure.

Referring to FIG. 1, a laser device 100 is provided according to an embodiment of the present disclosure. The laser device 100 includes a silicon-based field effect transistor 20 and at least one nanocrystal array 10. The silicon-based field effect transistor 20 functions as a power supply. The nanocrystal array 10 grows on the silicon-based field effect transistor 20. The laser device 100 may be used in a display device such as a micro panel or a laser projector. The laser device 100 may also be used in a wearable display device based on Augmented Reality (AR), Virtual Reality (VR), Substitutional Reality (SR), Mixed Reality (MR), or Extended Reality (XR).

As shown in FIG. 1, the laser device 100 further includes a conductive layer 30 and an electrode layer 40. The silicon-based field effect transistor 20 includes a substrate 2, at least one hole 3 defined in the substrate 2, and a drain electrode 4 formed in each hole 3. The substrate 2 includes a first surface 231 and a second surface 212 opposite to the first surface 231. The first surface 231 is recessed toward the second surface 212 to form the at least one hole 3. The nanocrystal array 10 grows on the surface of each drain electrode 4. The conductive layer 30 is formed on a surface of each nanocrystal array 10 away from the drain electrode 4. The electrode layer 40 is formed on a surface of each conductive layer 30 away from the nanocrystal array 10.

As shown in FIG. 1, the substrate 2 includes a silicon substrate 21, a first insulation layer 22, and a semiconductor layer 23 successively stacked on each other. The silicon substrate 21 includes a main surface 211 with (100) crystal plane. The first insulation layer 22 is located on the main surface 211. A surface of semiconductor layer 23 away from the first insulation layer 22 is defined as the first surface 231. A surface of silicon substrate 21 away from the main surface 211 is defined as the second surface 212. The semiconductor layer 23 is divided into a channel region 232, a drain region 233, and a source region 234. The drain region 233 and the source region 234 located on two opposite sides of the channel region 232. Each hole 3 is defined in the drain region 233. The hole 3 further sequentially passes through the semiconductor layer 23 and the first insulation layer 22 and then extends into the silicon substrate 21. A diameter of the hole 3 is about hundreds of nanometers. For example, the diameter of the hole 3 is in a range of 100 nanometers to 900 nanometers.

The hole 3 includes a sidewall 31 and a bottom surface 32 connecting to the sidewall 31. The bottom surface 32 is formed by the sidewall 31 extending downward. The bottom surface 32 is inclined along a specific crystal plane of the silicon substrate 21. Thus, the hole 3 includes a V-shaped groove at a bottom thereof. A protective layer 34 is formed on the sidewall 31. The bottom surface 32 has a (111) crystal plane of the silicon substrate 21. A drain buffer layer 33 is formed on the bottom surface 32. The drain electrode 4 is formed in the hole 3 and located on the drain buffer layer 33. In at least one embodiment, the protective layer 34 may be made of silicon nitride (SiNx), the drain buffer layer 33 may be made of aluminum nitride (AlN), and the drain electrode 4 may be made of gallium nitride (GaN). In at least one embodiment, the (111) crystal plane is formed inside the silicon substrate 21, which functions as a plane on which the aluminum nitride drain buffer layer 33 and the gallium nitride epitaxial layer (i.e., the drain electrode 4) nucleate. The hexagonal gallium nitride (h-GaN) monocrystals start to grow on the (111) crystal plane, and the lattice dislocation during the crystallization process will end at the sidewall 31 of the hole 3. When the hexagonal gallium nitride (h-GaN) monocrystals grown on the sidewall 31 merge in the middle of the hole 3, cubic gallium nitride (c-GaN) crystals with high crystallinity may be obtained. The selective growth technology can control and design the size and shape of the gallium nitride epitaxial layer, which can maintain the high-speed performance of the laser device. Moreover, due to the wider energy band of gallium nitride compared to silicon, an electron impact ionization coefficient may be reduced, and a breakdown voltage of the drain electrode 4 may be increased. At the same time, a silane gas may be introduced during the selective growth process, which can regulate the concentration of silicon doping in the gallium nitride epitaxial layer. The concentration of silicon doping can control a vertical leakage current, thereby obtaining the drain electrode 4 with a wide energy band.

As shown in FIG. 1, the silicon-based field effect transistor 20 further includes a second insulation layer 5 formed on a surface of the channel region 232, a gate electrode 6 formed on the second insulation layer 5, a source electrode 7 formed on the source region 234, and a third insulation layer 8 formed on the first surface 231. Each of the electrode layer 40 formed on the drain electrode 4, the gate electrode 6, and the source electrode 7 protrude from the third insulation layer 8. The third insulation layer 8 covers the nanocrystal array 10 and the conductive layer 30 located on the nanocrystal array 10.

Figure 2:
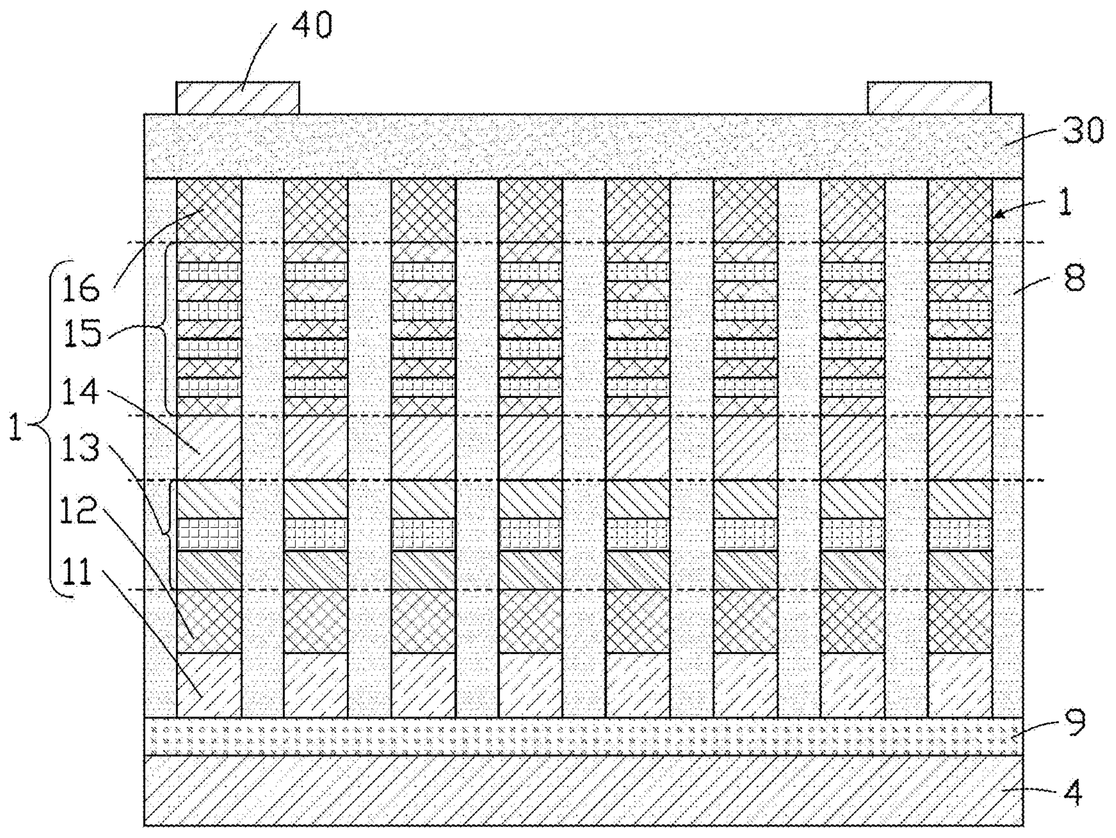
FIG. 2 is a cross-sectional view of a nanocrystal array of the laser device of FIG. 1.

Referring to FIGS. 1 and 2, the nanocrystal array 10 includes a number of nanorods 1 arranged in an array. Each nanorod 1 includes a nanorod buffer layer 11, a first type semiconductor layer 12, a tunnel junction layer 13, a second type semiconductor layer 14, a multi-quantum well 15, and a first type semiconductor layer 16 successively stacked on each other. The first and second types of semiconductor layers refer to semiconductor structures with different conductivity. If holes in a semiconductor structure function as the majority carriers, the semiconductor structure is a P-type semiconductor. If electrons in a semiconductor structure function as the majority carriers, the semiconductor structure is an N-type semiconductor. In at least one embodiment, each of the first type semiconductor layers 12 and 16 is an N-type gallium nitride layer. The second type semiconductor layer 14 is a P-type gallium nitride layer. Since the nanorods 1 are formed on the gallium nitride drain electrode 4, internal stresses caused by mismatching between the silicon lattices and the drain electrode 4 may be released. Thus, the energy (such as temperature or implantation energy) required for a subsequent ion doping process may be reduced, thus improving doping ionization and internal quantum efficiency. In at least one embodiment, the nanorod buffer layer 11 may be made of gallium nitrides, which can reduce the mismatching between the silicon lattices and the gallium nitride drain electrode 4. Thus, the internal stress of the nanorods 1 may be reduced.

Figure 3:
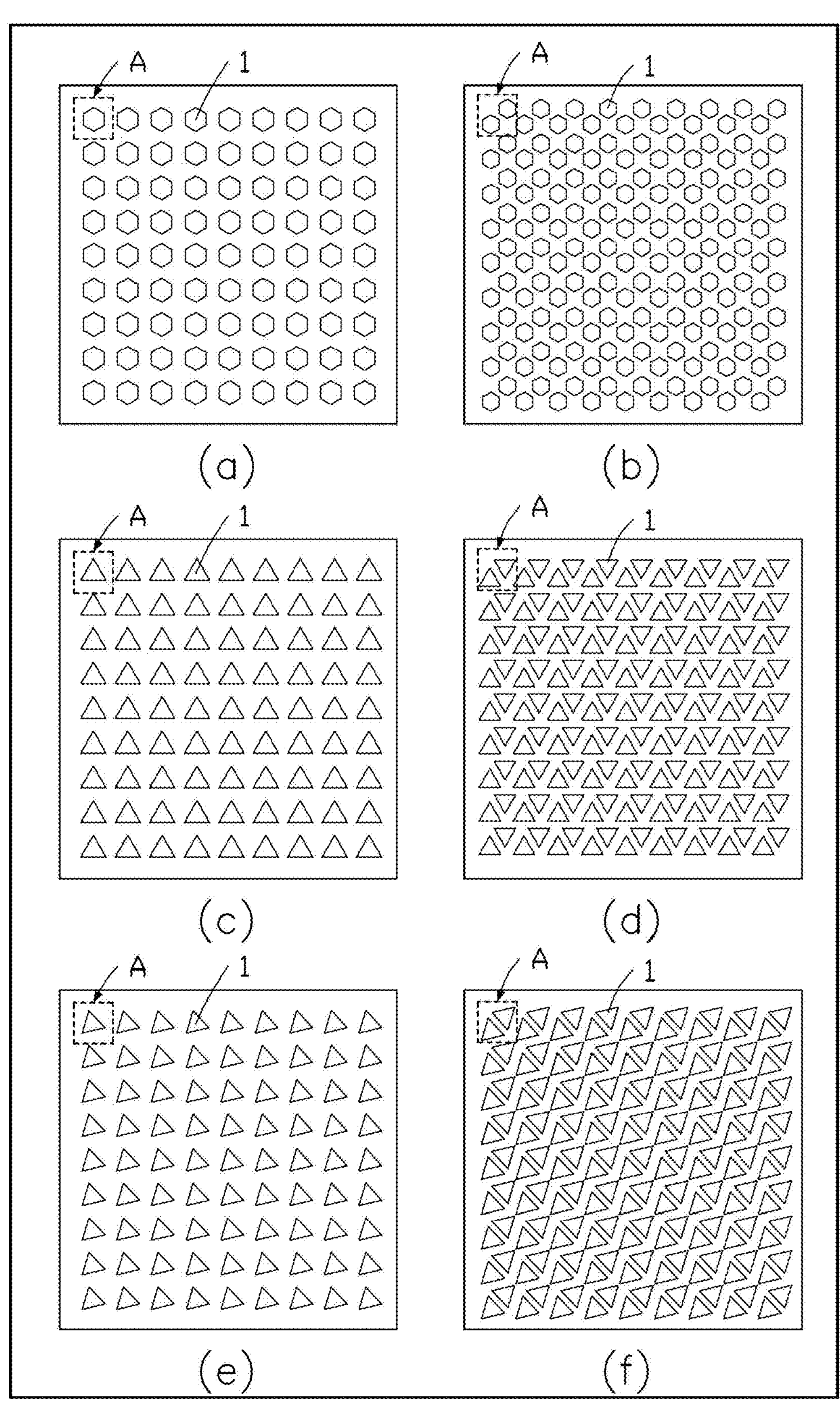
FIG. 3 is a top view of the nanocrystal array of FIG. 2 with different structures.
Figure 4:
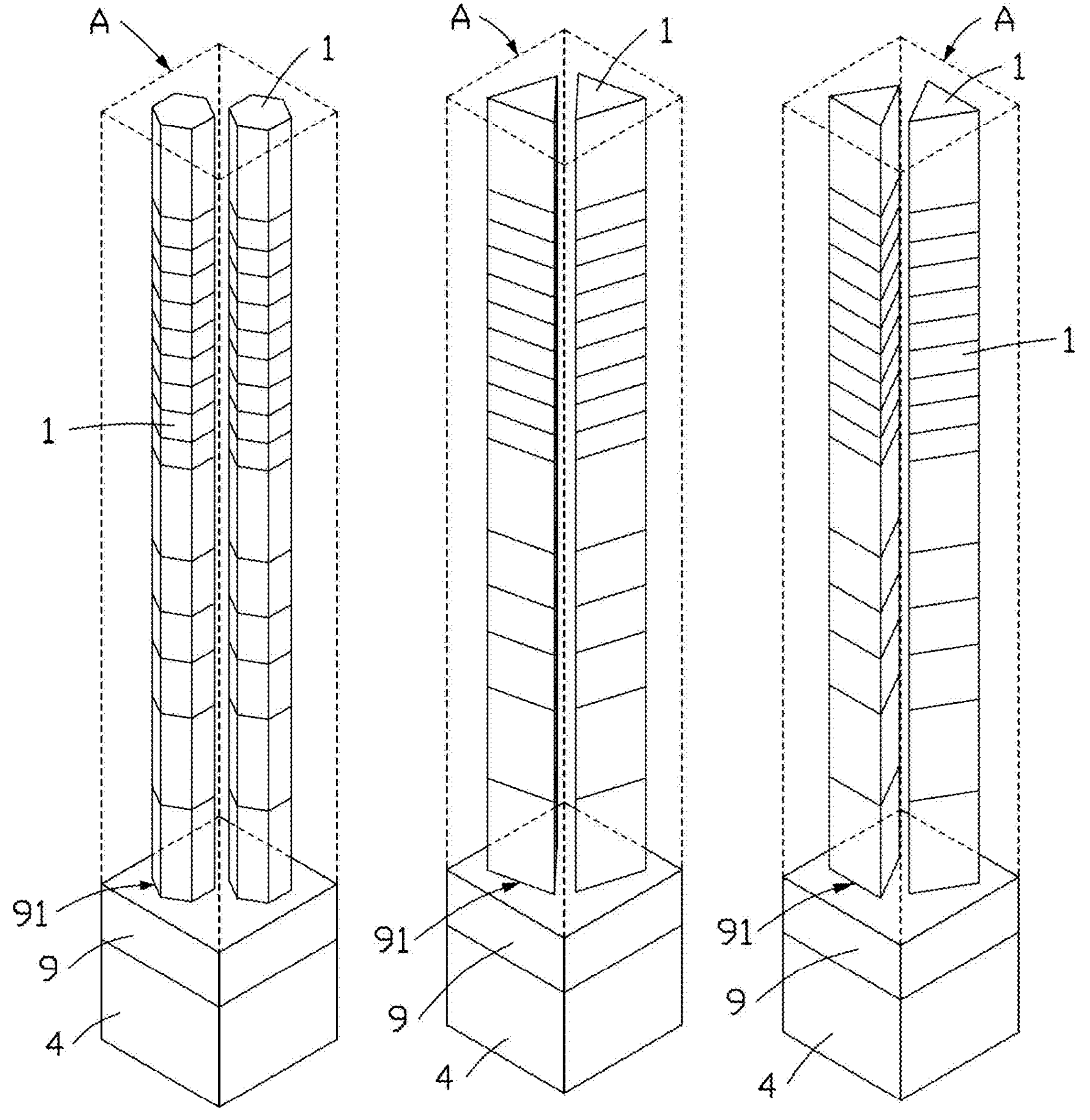
FIG. 4 is a diagrammatic view showing nanorods with different structures within a single unit cell of the nanocrystal array of FIG. 2.
Figure 5:
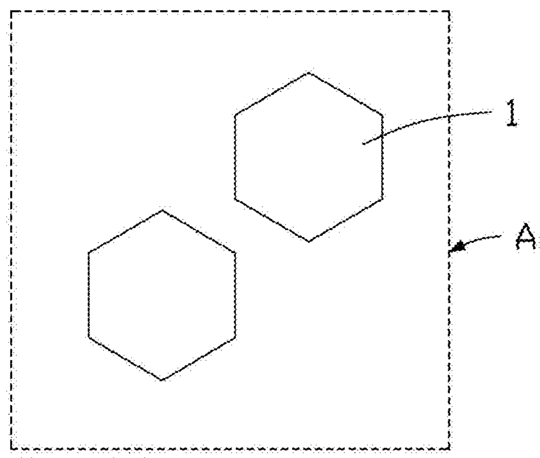
FIG. 5 is a top view of the nanorods within the unit cell of FIG. 4.
Figure 5:
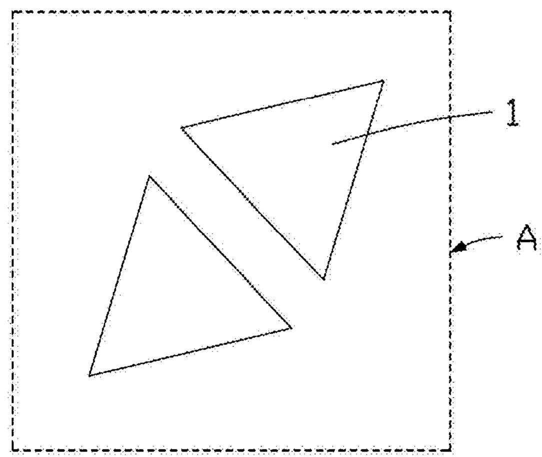
Figure 5:
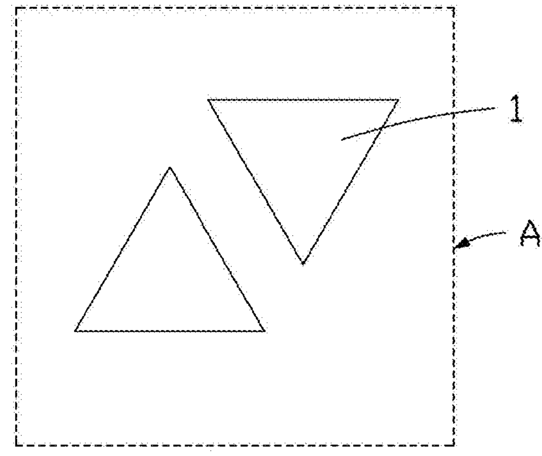

Referring to FIGS. 3 to 5, the sizes, spacings, and shapes of the nanorods 1 of the nanocrystal array 10 are controlled. The cross-section of each nanorod 1 may be hexagonal or triangular. The nanocrystal array 10 includes a number of rows of nanorods 1, and each row includes a number of columns of nanorods 1. The nanocrystal array 10 includes a number of unit cells A periodically arranged. Each unit cell A may include only one nanorod 1. Each unit cell may also include two or more than two nanorods 1. In the present disclosure, adjacent ones of the unit cells A are spaced from each other by a same distance. That is, the unit cells A are periodically arranged. As shown in FIG. 3, there are nine unit cells A in each rows of the nanocrystal array 10. That is, the number of periods of the unit cells A is nine (i.e., N=9). The nanorods 1 have a same length, smooth sidewalls, and a high aspect ratio. Since the nanorod 1 can release transverse stresses, mismatch will not happen in the nanostructure of each nanorod 1, which can reduce lattice dislocation and epitaxial defects. A laser extraction direction of the nanorod 1 may be controlled by controlling the structure of the nanocrystal array 10. The laser wavelength and emission direction may be controlled by adjusting the number of periods N of the unit cells A and an optical mode. Thus, the periodically arranged nanorods 1 have advantages in modal control and wavelength adjustment. When the unit cell A includes at least two nanorods 1, the laser threshold may be reduced, and the output power may be increased. In addition, the nanocrystal array 10 can further improve the collimation of the laser beam, reduce the divergence angle and the size of the laser spots, thereby improving the resolution and image quality of the display device. In at least one embodiment, the nanorods 1 of the nanocrystal array 10 are arranged in tetragonal crystal lattices. Each tetragonal crystal lattice has at least one nanorod 1. In other embodiments, the crystal lattices may also be hexagonal or cellular.

Figure 6:
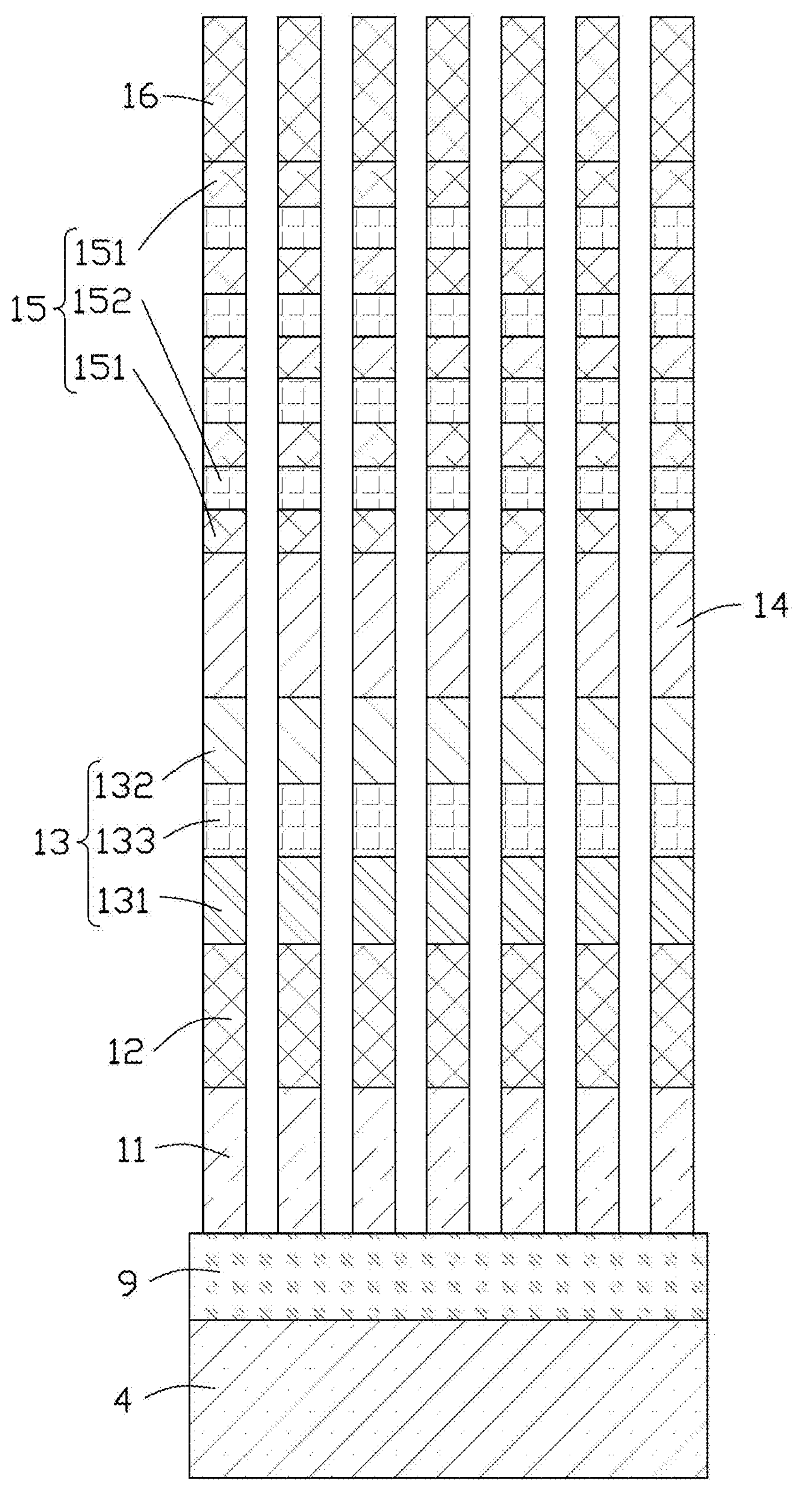
FIG. 6 is a cross-sectional view of the nanorods of the laser device of FIG. 1.

Referring to FIG. 6, the tunnel junction layer 13 includes an N-type gallium nitride heavily doped layer 131 adjacent to the first type semiconductor layer 12, a P-type gallium nitride heavily doped layer 132 adjacent to the second type semiconductor layer 14, and an indium gallium nitride layer 133 located between the N-type gallium nitride heavily doped layer 131 and the P-type gallium nitride heavily doped layer 132. That is, the tunnel junction layer 13 has a structure of N++ type GaN/InGaN/P++ type GaN. By inserting the tunnel junction layer 13 between the first type semiconductor layer 12 and the second type semiconductor layer 14 of the nanorod 1, the carrier concentration injected into the multi-quantum well 15 may be increased, thereby enhancing the luminescence efficiency. Moreover, in an existing nanocrystal structure, a P-type gallium nitride layer is directly in contact with the conductive layer. Due to the high resistance of the P-type gallium nitride, the threshold current of the laser device is high. In the present disclosure, by adding the tunnel junction layer 13, the types of the doped semiconductor layers on two sides of the multi-quantum well 15 can be exchanged. The first type semiconductor layer 16 instead of the second type semiconductor layer 14 (i.e., P-type gallium nitride layer) is in direct contact with the conductive layer 30. Therefore, the threshold current of the laser device may be reduced. In addition, the indium gallium nitride layer 133, which is located between the N-type gallium nitride heavily doped layer 131 and the P-type gallium nitride heavily doped layer 132, can align edges of the energy bands on two sides with each other to improve the tunneling effect.

Referring to FIG. 6, the multi-quantum well 15 includes a number of gallium nitride energy barrier layers 151 and a number of indium gallium nitride energy well layers 152 alternately arranged on the second type semiconductor layer 14. One of the gallium nitride energy barrier layers 151 is in contact with the second type semiconductor layer 14. Each indium gallium nitride energy well layer 152 is arranged between adjacent ones of the gallium nitride energy barrier layers 151. The structural design of the nanorods 1 can cause the photons to surround the indium gallium nitride energy well 152 (i.e., the indium gallium nitride active layer), thereby increasing the photon density around the indium gallium nitride active layer. Moreover, due to the Purcell effect in the micro resonant cavity, the radiative lifetime of the photons may be shortened, thereby improving the quantum efficiency in the nanorods 1. In addition, when selecting different wavelengths, the multi-quantum well 15 can grow on the polar, semi-polar, or non-polar P-type gallium nitride layer.

Figure 7:
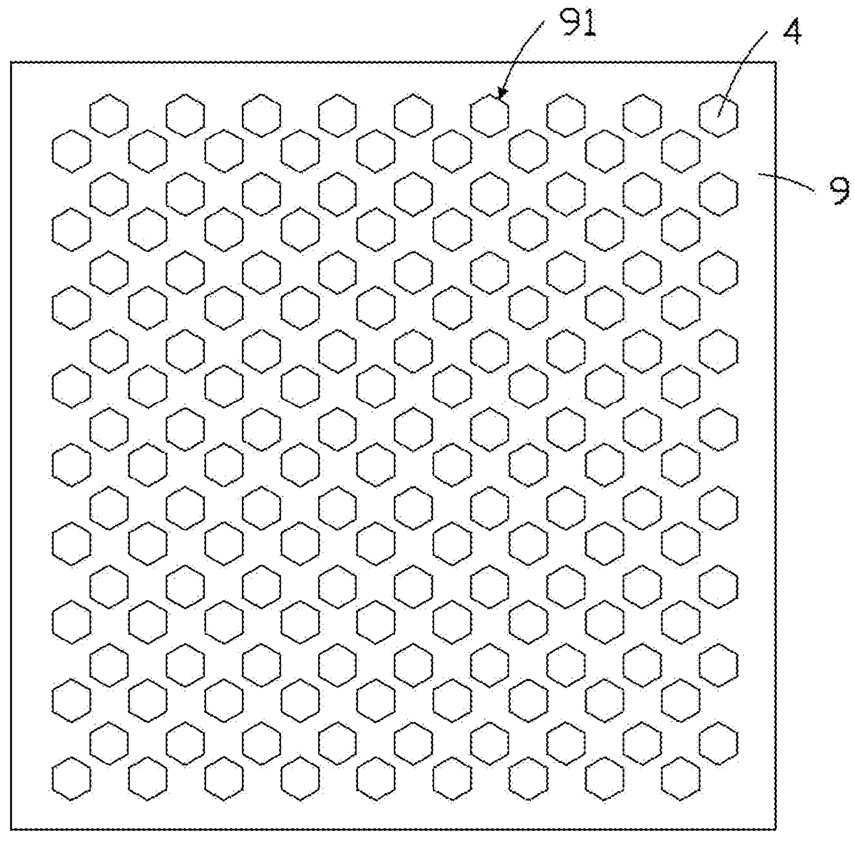
FIG. 7 is a top view of a selective growth layer of the laser device of FIG. 1.

Referring to FIGS. 1, 4 and 7, the laser device 100 further includes a selective growth layer 9 located on the drain electrode 4. A number of through holes 91 are defined in the selective growth layer 9. A surface of the drain electrode 4 is exposed from each through hole 91. Each nanorod 1 grows within one through hole 91. A Selective Area Epitaxy (SAE) technology may be used to grow the nanocrystal array 10 with desired patterns on the drain electrode 4. For example, the selective growth layer 9 is first deposited on the gallium nitride drain electrode 4, and the desired patterns such as hexagonal or triangular shown in FIG. 3 are defined in the selective growth layer 9, thereby forming the through holes 91. Afterwards, an epitaxial material will grow within the through holes 91 to form the nanorods 1. When the SAE technology is used to form the nanocrystal array 10 in the selective growth layer 9, the differences between the nanorods 1 may be reduced.

In at least one embodiment, the selective growth layer 9 may include at least one of silicon dioxide ($SiO_2$), silicon nitride ($SiN_x$), titanium dioxide ($TiO_2$), tungsten (W), and titanium (Ti).

The conductive layer 30 may include indium tin oxide (ITO), titanium (Ti), gold (Au), or titanium gold alloy. In at least one embodiment, as shown in FIGS. 8A and 8B, the conductive layer 30 is a transparent ITO layer.

Figure 8A:
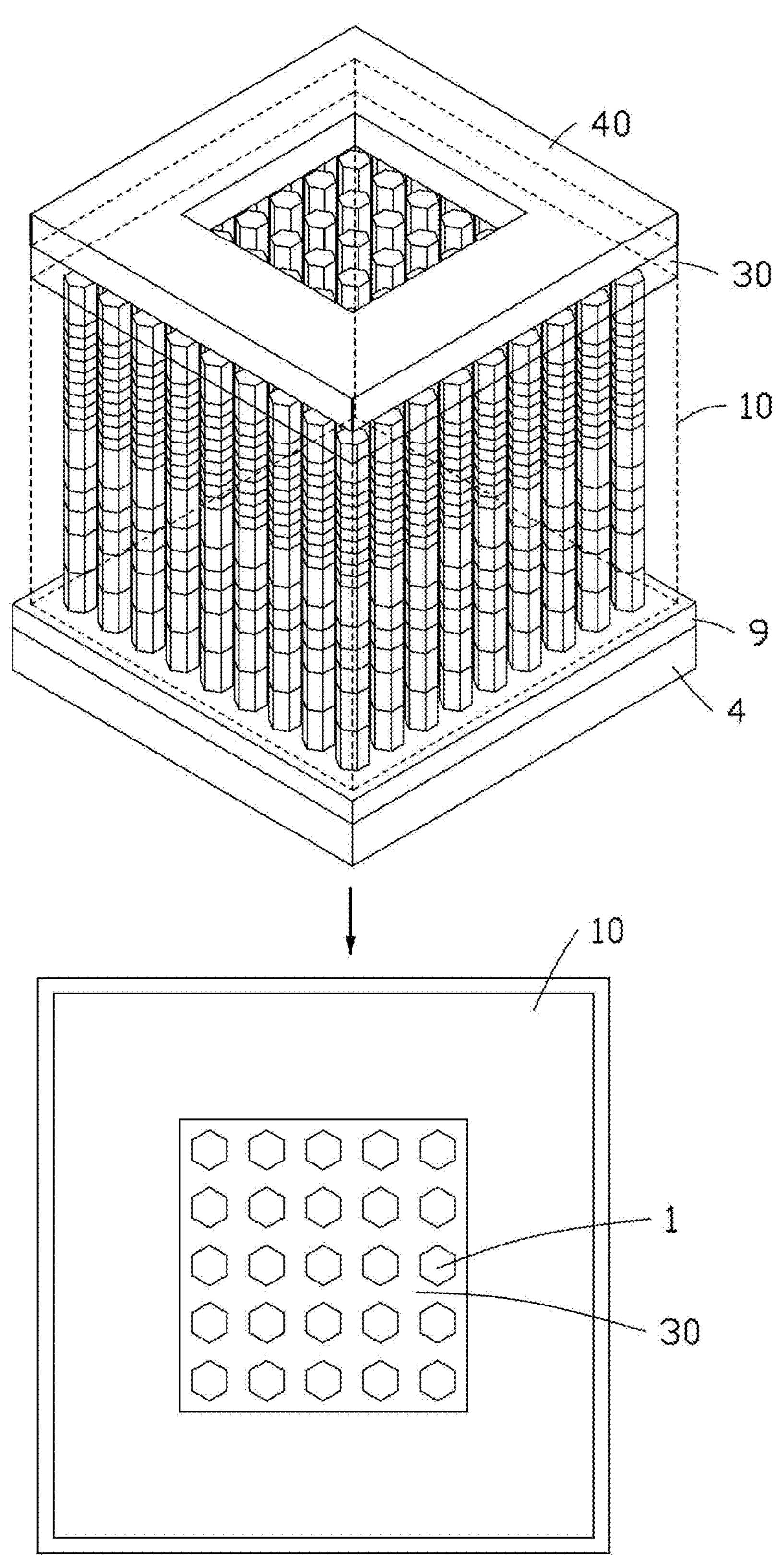
FIG. 8A is a diagrammatic view showing an electrode layer located on the nanocrystal arrays of the laser device of FIG. 1.
Figure 8B:
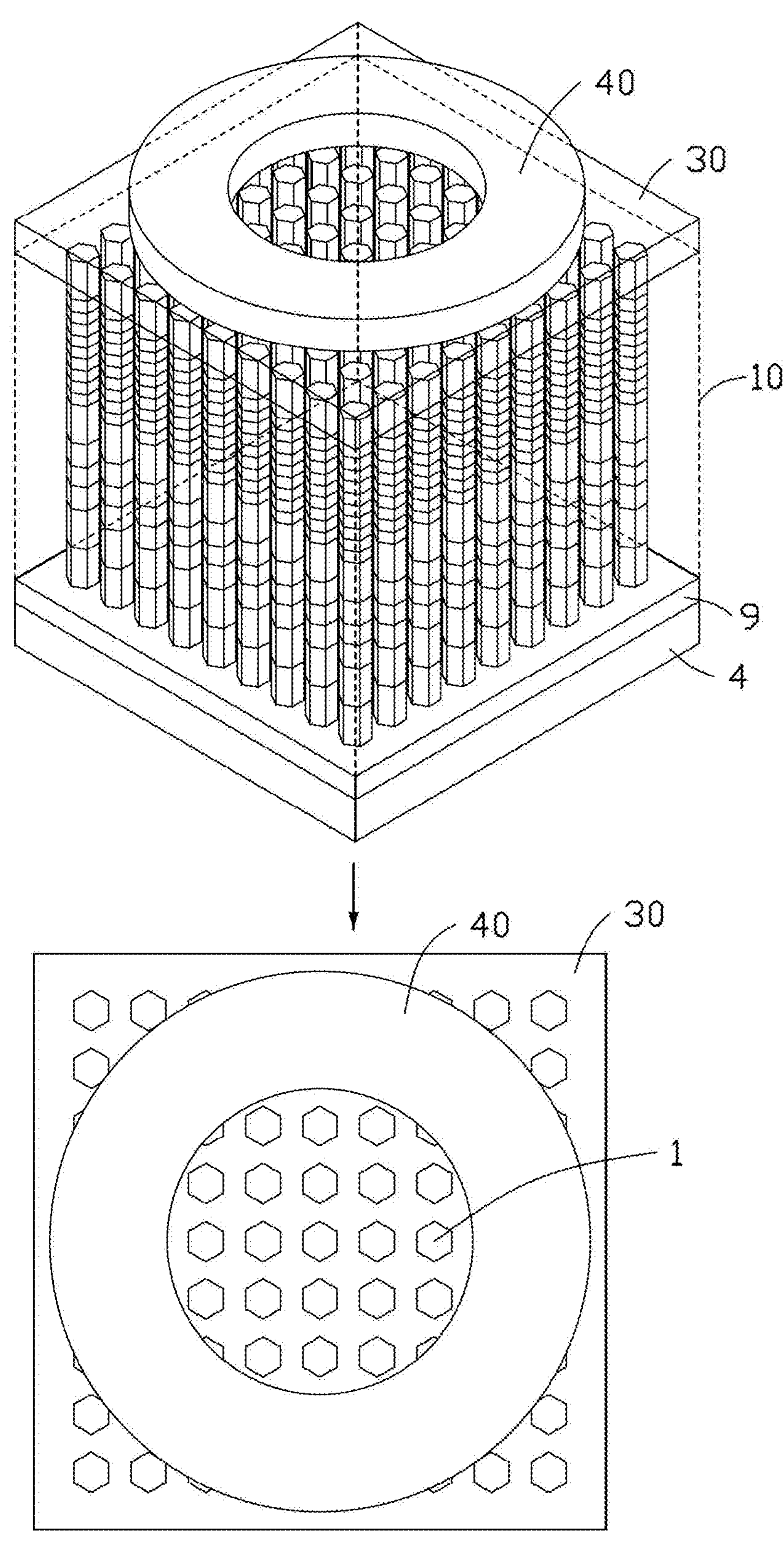
FIG. 8B is a diagrammatic view showing another electrode layer located on the nanocrystal arrays of the laser device of FIG. 1.

Referring to FIGS. 8A and 8B, the electrode layer 40 may be a hollow polygonal structure or an annular structure located on the conductive layer 30. The drain electrode 4 may be connected to a controller through the electrode layer 40. Different patterns of laser spots may be generated by changing the shape of the electrode layers 40. In at least one embodiment, the electrode layer 40 may include titanium (Ti), gold (Au), or titanium gold alloy.

Figure 9A:
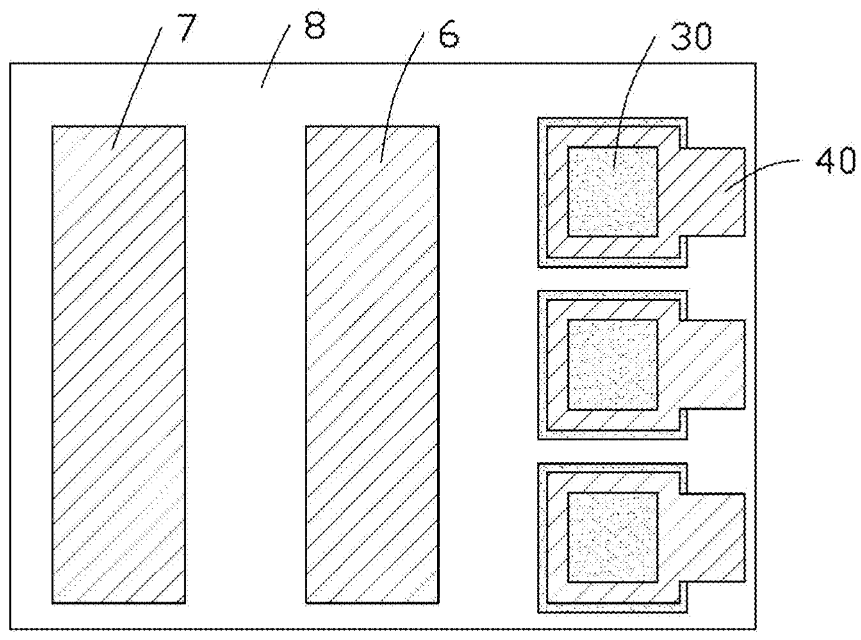
FIG. 9A is a top view showing a source electrode and a gate electrode located on the nanocrystal arrays of the laser device of FIG. 1.
Figure 9B:
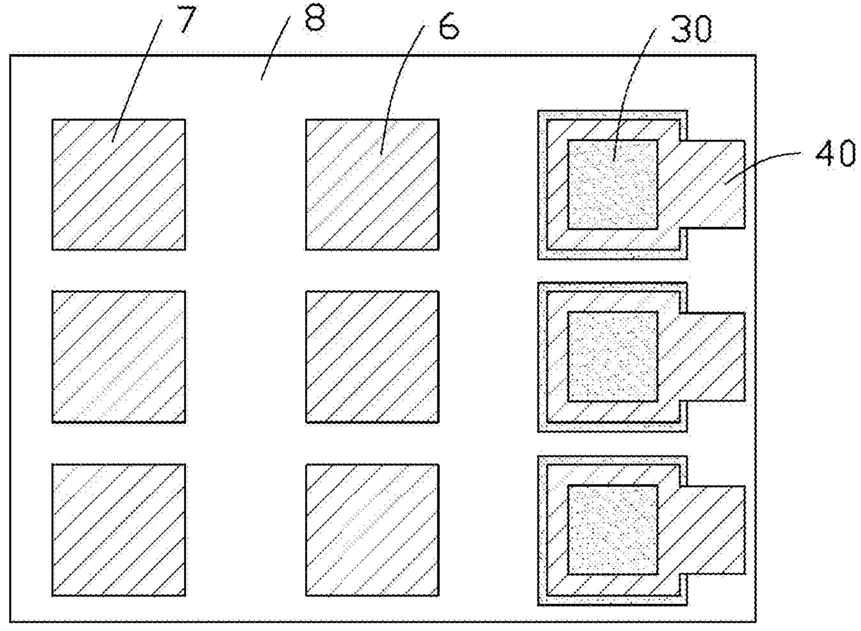
FIG. 9B is a top view showing a number of source electrodes and a number of gate electrodes located on the nanocrystal arrays of the laser device of FIG. 1.

Referring to FIG. 9A, in at least one embodiment, a number of drain electrodes 4 may be included. All the drain electrodes 4 corresponds to one gate electrode 6 and one source electrode 7. In another embodiment shown in FIG. 9B, each drain electrode 4 corresponds to one gate electrode 6 and one source electrode 7. Therefore, the drain electrodes 4 may be simultaneously or independently controlled, allowing the control manner to be flexible. In at least one embodiment, both the gate electrode 6 and the source electrode 7 are made of metal.

Figure 10A:
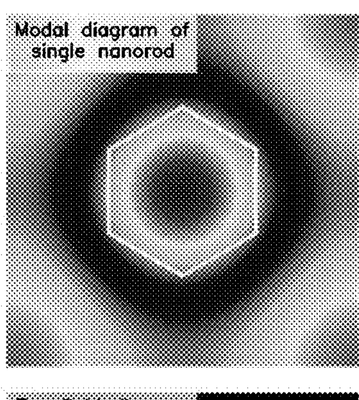
FIG. 10A shows a modal diagram of a unit cell having a hexagonal nanorod and a simulation diagram of far-field light spot of the unit cell.
Figure 10A:
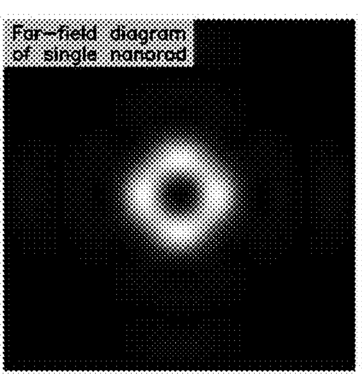
Figure 10B:
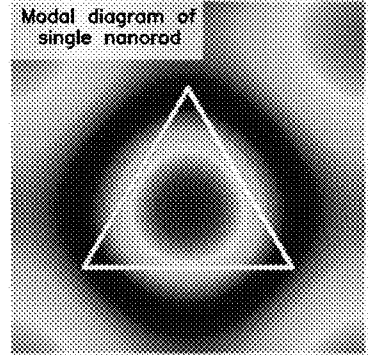
FIG. 10B shows a modal diagram of a unit cell having a triangular nanorod and a simulation diagram of far-field light spot of the unit cell.
Figure 10B:
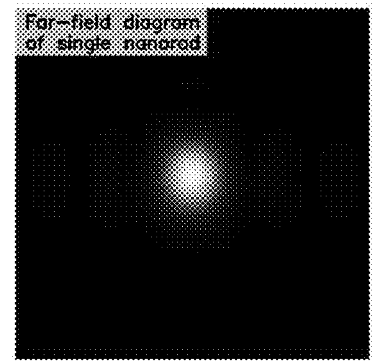
Figure 10C:
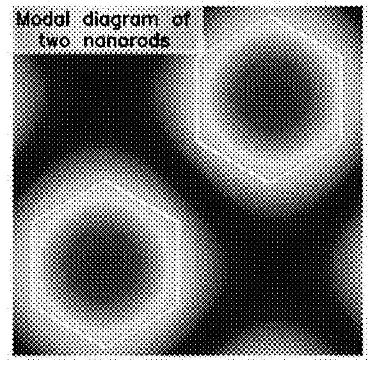
FIG. 10C shows a modal diagram of a unit cell having two hexagonal nanorods and a simulation diagram of far-field light spot of the unit cell.
Figure 10C:
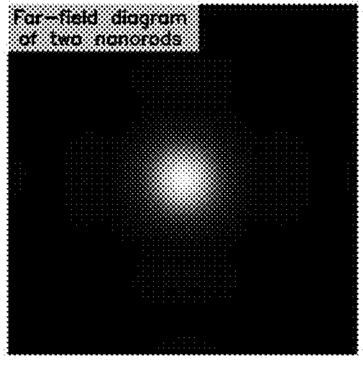
Figure 10D:
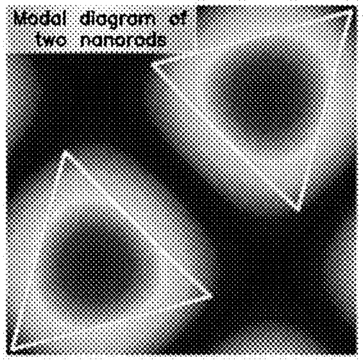
FIG. 10D shows a modal diagram of a unit cell having two triangular nanorods and a simulation diagram of far-field light spot of the unit cell.
Figure 10D:
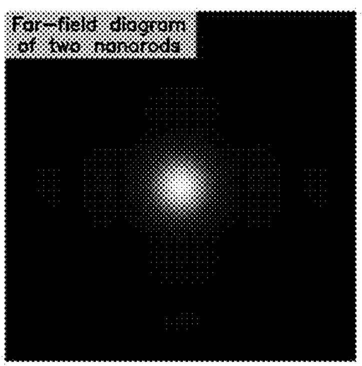

Due to the Wurtzite lattice properties of gallium nitride, triangular and hexagonal nanorods 1 may be made by the SAE technology. Taking the number of periods N of the unit cells A to be 40 for example, FIG. 10A shows a modal diagram of a unit cell A having a hexagonal nanorod 1 (the upper diagram) and a simulation diagram of far-field light spot of the unit cell A (the lower diagram). FIG. 10B shows a modal diagram of a unit cell A having a triangular nanorod 1 (the upper diagram) and a simulation diagram of far-field light spot of the unit cell A (the lower diagram). FIG. 10C shows a modal diagram of a unit cell A having two hexagonal nanorods 1 (the upper diagram) and a simulation diagram of far-field light spot of the unit cell A (the lower diagram). FIG. 10D shows a modal diagram of a unit cell A having two triangular nanorods 1 (the upper diagram) and a simulation diagram of far-field light spot of the unit cell A (the lower diagram). From FIGS. 10A to 10D, the far-field light spot of a single triangular nanorod is different from that of a single hexagonal nanorod. This is because the structural symmetry of a hexagonal structure (C6 symmetry) is higher than compared to the structural symmetry of a triangular structure (C3 symmetry), namely, the triangular structure has a lower symmetry in the horizontal and vertical directions. As shown in the upper diagrams of FIG. 10B and FIG. 10D, the light spot is symmetrical in the horizontal direction but asymmetric in the vertical direction. Therefore, the triangular nanorod may disrupt phase symmetry, resulting in a solid far-field light spot. However, as shown in the upper diagram of FIG. 10A, when the hexagonal nanorod is used, the far-field light spot becomes annular in shape with a lower light intensity in the center. This happens due to the structural symmetry of the hexagonal nanorod. Furthermore, since the nanorods 1 may be different to each other due to some factors in the growth process, the size and shape of the annular light spot may be uneven, and there is halo around the annular light spot. Furthermore, the power is low due to the structural symmetry of the hexagonal shape, resulting in insufficient brightness of the light spot to cover the halo, so the image may not be pure enough. Two nanorods in each unit cell A can disrupt symmetry, resulting in a higher brightness of the light spot. Thus, no halo forms around the light spot as shown in the lower diagrams of FIGS. 10C and 10D, so the light spot is clearer, and the shape of the light spot is more uniform. Moreover, when the number of periods N is small ($N^2$ is equal to an area of photonic crystal), the triangular nanorod can have a smaller and brighter light spot. No halo forms around the light spot. Thus, the resolution and image quality of the display are improved.

Referring to FIGS. 11A to 14, taking a tetragonal crystal lattice for example, simulation analysis is performed on a unit cell A, which includes a hexagonal nanorod 1 or two hexagonal nanorods 1.

Figure 11A:
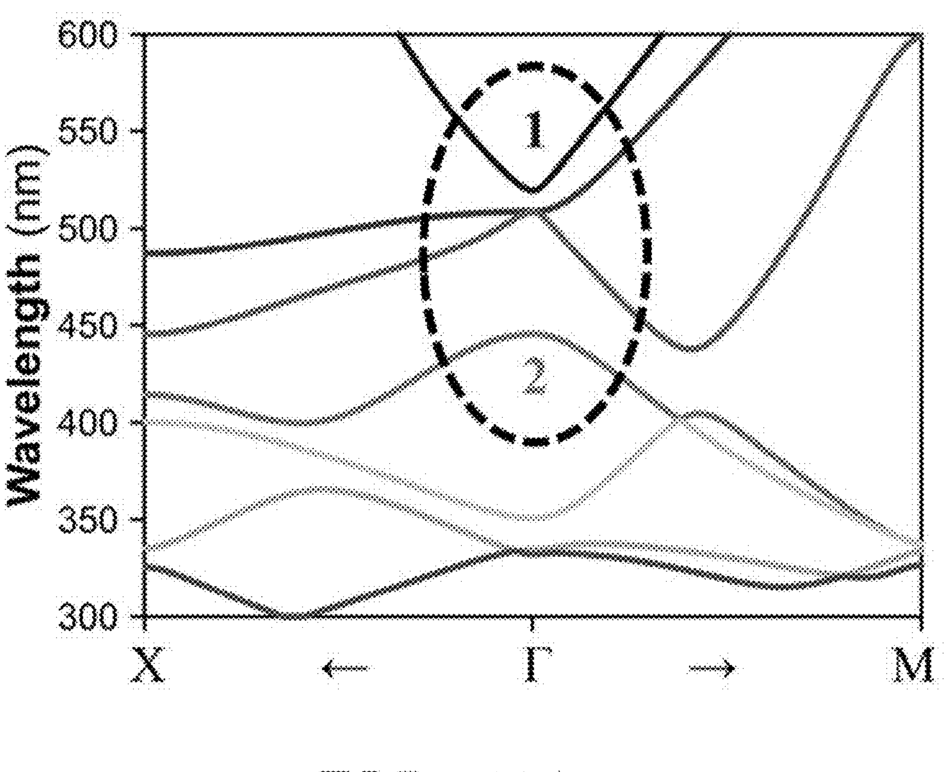
FIG. 11A is an energy band diagram of a unit cell including only one hexagonal nanorod.
Figure 11B:
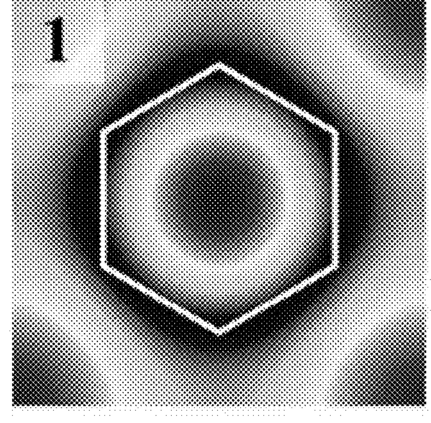
FIGS. 11B and 11C are modal diagrams of the unit cell including only one hexagonal nanorod.
Figure 11C:
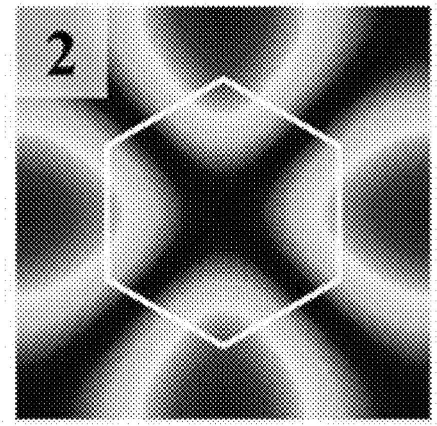
Figure 12A:
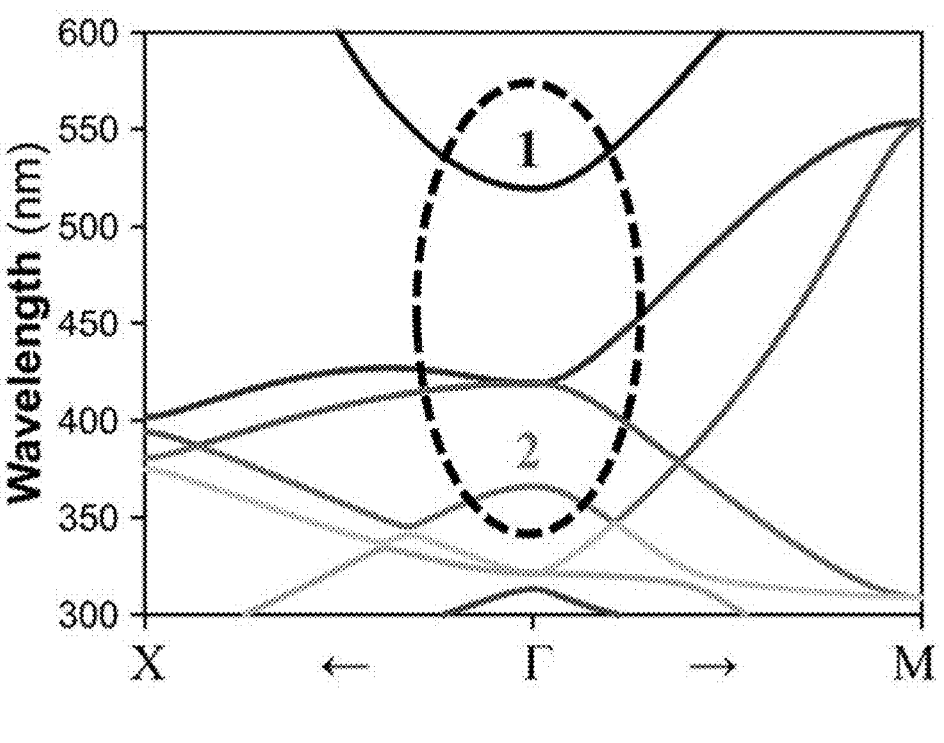
FIG. 12A is an energy band diagram of a unit cell including two hexagonal nanorods.
Figure 12B:
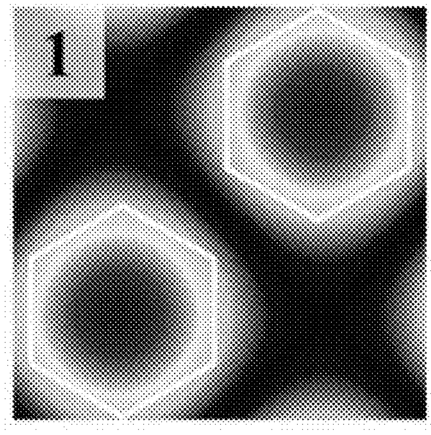
FIGS. 12B and 12C are modal diagrams of the unit cell including two hexagonal nanorods.
Figure 12C:
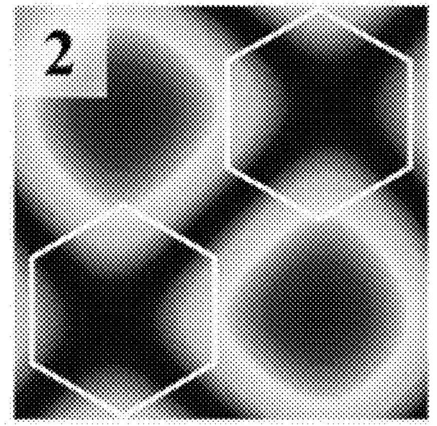

FIG. 11A is an energy band diagram of the unit cell including only one hexagonal nanorod 1. FIGS. 11B and 11C show modal diagrams of the unit cell including only one hexagonal nanorod 1. FIG. 12A is an energy band diagram of the unit cell including two hexagonal nanorods 1. FIGS. 12B and 12C show modal diagrams of the unit cell including two hexagonal nanorods 1. In several energy bands are shown in a dashed circle of FIG. 11A, the wavelengths of three upper modals at the point F are very close, causing the modal dominant in laser behavior to shift from modal 1 to other higher-order modals (i.e., the modal below modal 1) due to some process factors. However, the optical coupling effect between the higher-order modal and the nanorod 1 is poor, so the nanorod 1 is difficult to achieve profit and loss balance. That is, adjacent energy bands in the dashed circle are close, so that adjacent modals may compete for the optical gain of quantum wells, thereby increasing the laser threshold while reducing the output power. As shown in FIG. 12A, when two nanorods 1 are located in a unit cell A, the wavelengths of the three upper modals are away from each other. That is, the wavelength of the modal 1 at point F is away from the wavelengths of other modals, so other modals will not participate in the generation of laser beam. That is, competition between different modals is avoided. Thus, the nanorod 1 can achieve gain and loss balance and emit laser beam. The optical gain is significant, which reduces the laser threshold and improves the output power. The optical coupling effect between the electric field distribution of high-order modals with short wavelengths and the nanorod 1 is poor as shown in FIGS. 11C and 12C. The optical coupling effect between the electric field distribution of low-order modals with long wavelengths and the nanorod 1 is good. Therefore, a base modal with a longest wavelength (i.e., a lowest frequency) is used to improve the optical coupling effect between the fundamental modal and the nanorod 1, as shown in FIGS. 11B and 12B. Different from FIGS. 11B and 11C, when two nanorods 1 are placed in a unit cell A, the wavelengths of the three upper modals can be away from each other as shown in FIGS. 12B and 12C, which may reduce the laser threshold and increase the output power. Therefore, a tetragonal lattice is chosen in the present disclosure, and two nanorods 1 are placed within one unit cell A.

Figure 13:
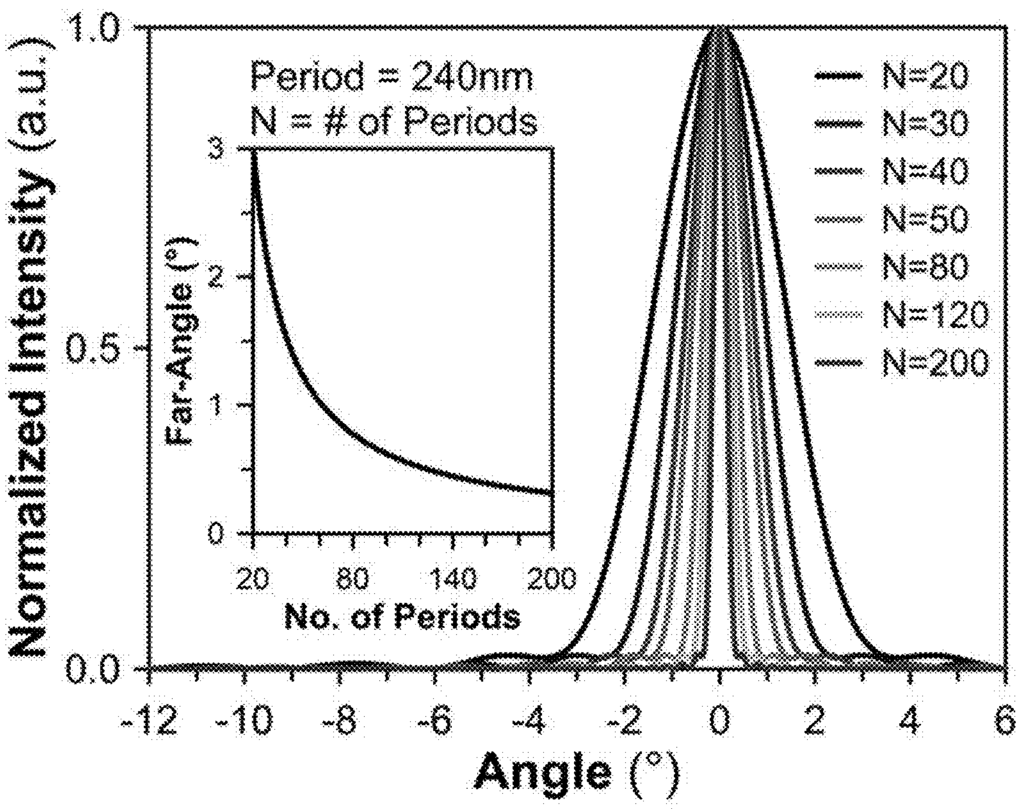
FIG. 13 is a diagram showing a relationship between divergence angles of a laser beam and the number of periods of the unit cells, where each unit cell includes two hexagonal nanorods.

FIG. 13 is a diagram showing a relationship between divergence angles of a laser beam and the number of periods N of the unit cells A, where each unit cell A includes two hexagonal nanorods 1. As shown in FIG. 13, the larger the number of periods N, the smaller the size of the far-field spot. When two nanorods 1 are used and the number of periods N is from 20 to 60, the divergence angle (FWHM of each Gaussian curve in FIG. 13) quickly decreases from 3 degrees to 1 degree. When the number of periods N is larger than 100, the divergence angle gradually decreases. When the number of periods N is equal to 200 (the pattern length of the photonic crystal is 48 μm), the divergence angle is 0.3 degrees. Therefore, the unit cell A including two nanorods 1 may reduce the divergence angle of the laser beam.

Figure 14A:
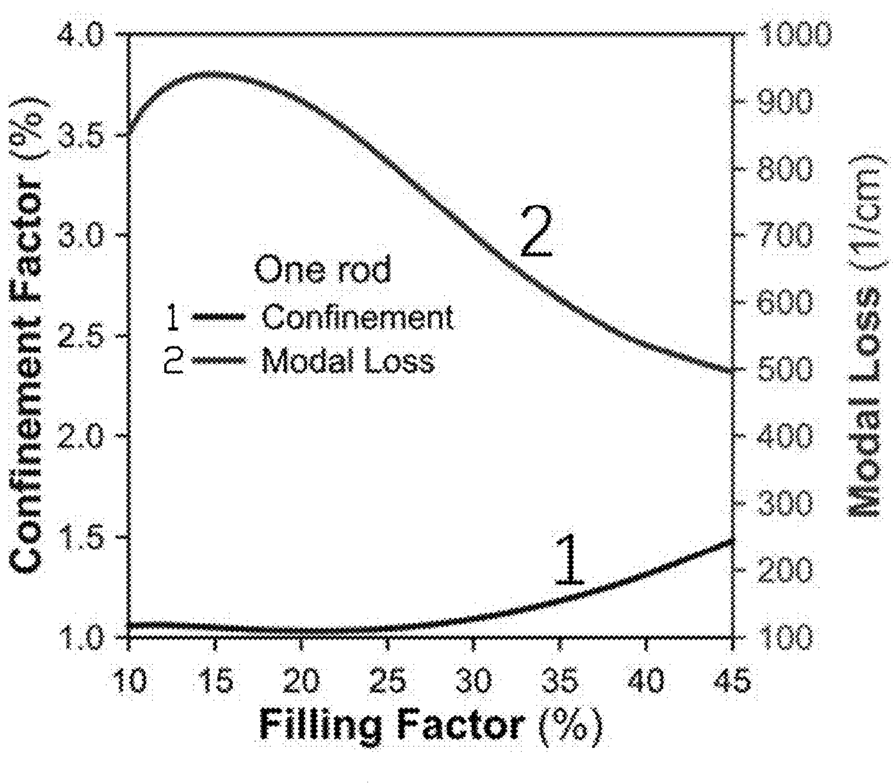
FIG. 14A is a diagram showing a relationship between confinement factors/modal loss with filling factors, where each unit cell includes only one hexagonal nanorod.
Figure 14B:
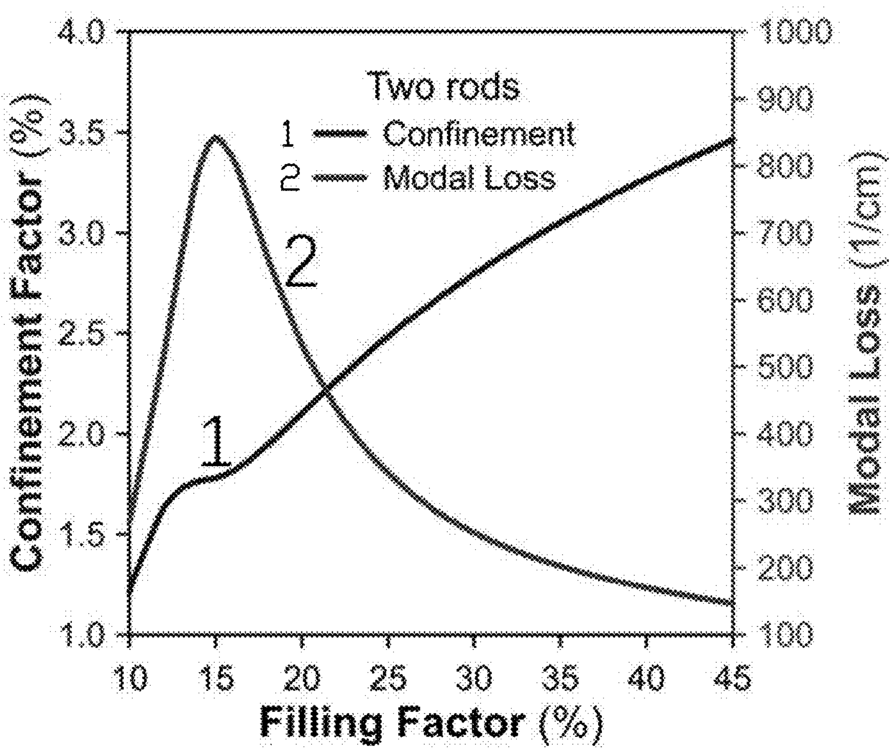
FIG. 14B is a diagram showing a relationship between confinement factors/modal loss with filling factors, where each unit cell includes two hexagonal nanorods.

FIG. 14A is a diagram showing a relationship between confinement factors/modal loss with filling factors, where each unit cell A includes only one hexagonal nanorod 1. The filling factor is equal to a cross-sectional area of the nanorod 1 divided by the square of the number of periods). FIG. 14B is a diagram showing a relationship between confinement factors/modal loss with filling factors, where each unit cell A includes two hexagonal nanorods. As shown in FIGS. 14A and 14B, when the filling factor increases, the confinement factor (Line 1) becomes larger. Compared with a single nanorods 1 in the unit cell A, the confinement factor increases when two nanorods 1 are included in the unit cell A. When the filling factor is greater than 15%, the modal loss (Line 2) when two nanorods 1 are included in the unit cell A decrease rapidly. Therefore, two nanorods 1 in the unit cell A may reduce the laser threshold and improve the output power.

Figure 16:
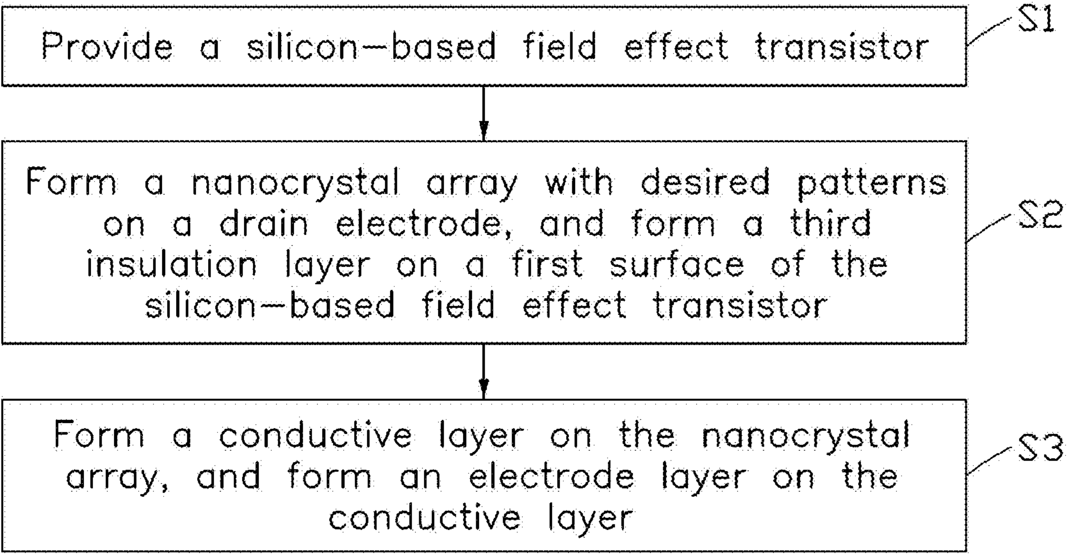
FIG. 16 is a flowchart of a method for preparing a laser device according to an embodiment of the present disclosure.

Referring to FIG. 16, a method for preparing a laser device 100 is also presented in accordance with an embodiment. The method is provided by way of example, as there are a variety of ways to carry out the method. The method can begin at step S1.

Step S1, as shown in FIG. 1, a silicon-based field effect transistor 20 is provided, which includes a substrate 2, at least one hole 3 formed in the substrate 2, and a drain electrode 4 formed in each hole 3. The substrate 2 includes a first surface 231 and a second surface 212 opposite to the first surface 231. The first surface 231 is recessed toward the second surface 212 to form the at least one hole 3. Each nanocrystal array 10 grows on one drain electrode 4. The conductive layer 30 is formed on a surface of each nanocrystal array 10 away from the drain electrode 4. The electrode layer 40 is formed on a surface of each conductive layer 30 away from the nanocrystal array 10.

In at least one embodiment, the substrate 2 includes a silicon substrate 21, a first insulation layer 22, and a semiconductor layer 23 successively stacked on each other. The silicon substrate 21 includes a main surface 211 with (100) crystal plane. The first insulation layer 22 is located on the main surface 211. A surface of semiconductor layer 23 away from the first insulation layer 22 is defined as the first surface 231. A surface of silicon substrate 21 away from the main surface 211 is defined as the second surface 212.

Step S2, a nanocrystal array 10 with desired patterns are formed on the drain electrode 4. A third insulation layer 8 is further formed on the first surface 231, and the nanocrystal array 10 protrudes from the third insulation layer 8.

In at least one embodiment, a Selective Area Epitaxy (SAE) technology may be used to grow the nanocrystal array 10 with desired patterns on the drain electrode 4. For example, the selective growth layer 9 is first deposited on the gallium nitride drain electrode 4, and the desired patterns such as hexagonal or triangular shown in FIG. 3 are defined in the selective growth layer 9, thereby forming the through holes 91. Afterwards, an epitaxial material will grow within the through holes 91 to form the nanorods 1.

Step S3, referring to FIG. 1, a conductive layer 30 is formed on the nanocrystal array 10. An electrode layer 40 is then formed on the conductive layer 30.

Figure 17:
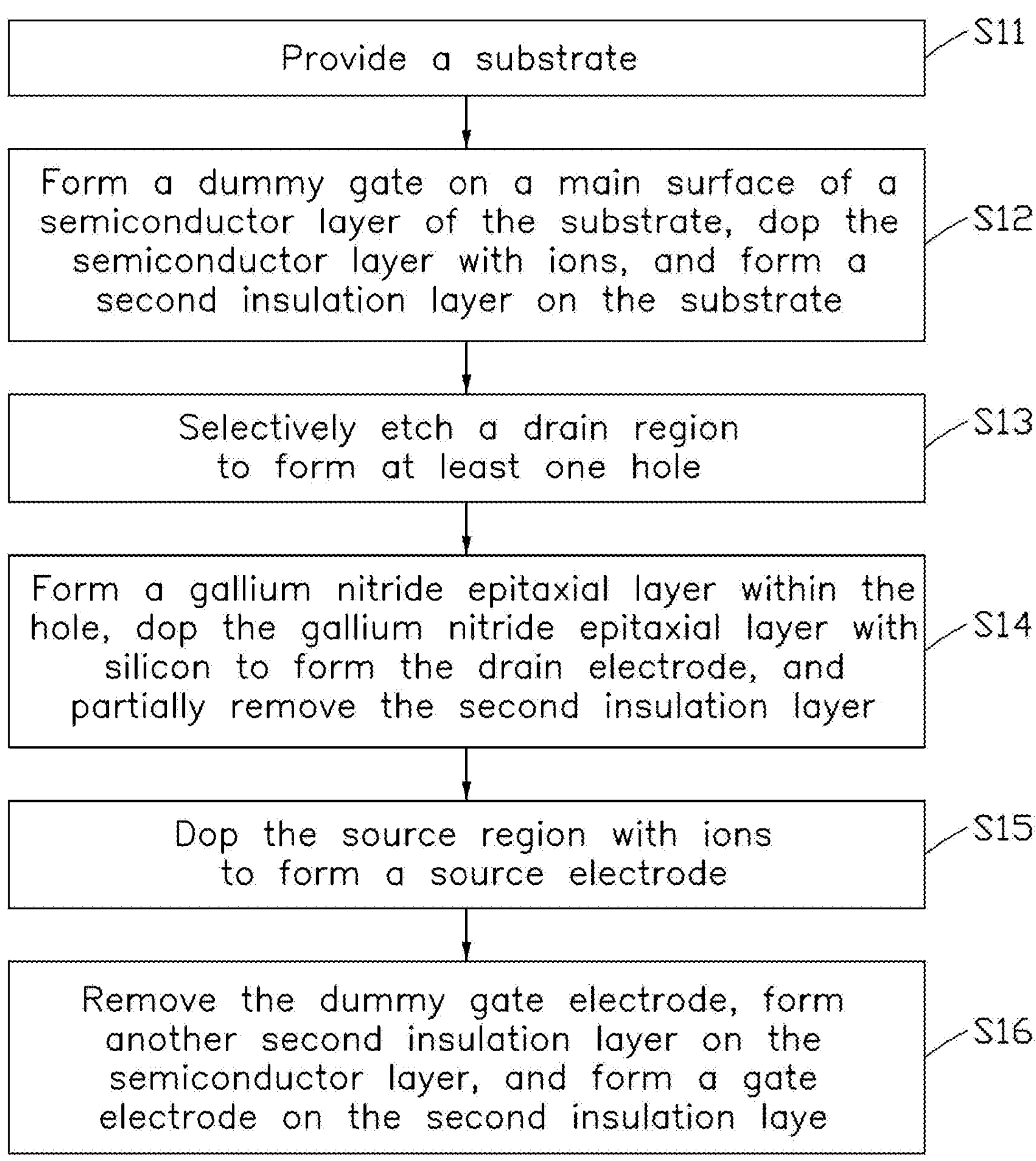
FIG. 17 is a flowchart of a method for preparing a silicon-based field effect transistor according to an embodiment of the present disclosure.

Referring to FIG. 17, a method for preparing the silicon-based field effect transistor 20 in S1 is also presented in accordance with an embodiment. The method is provided by way of example, as there are a variety of ways to carry out the method. The method can begin at step S11.

Figure 15A:
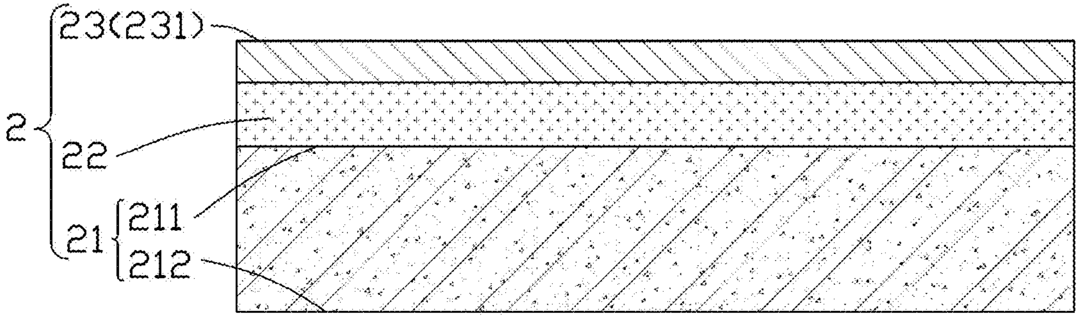
FIGS. 15A to 15F are diagrammatic views showing a method for preparing a silicon-based field effect transistor of the laser device of FIG. 1.

Step S11, as shown in FIG. 15A, the substrate 2 is provided.

Figure 15B:
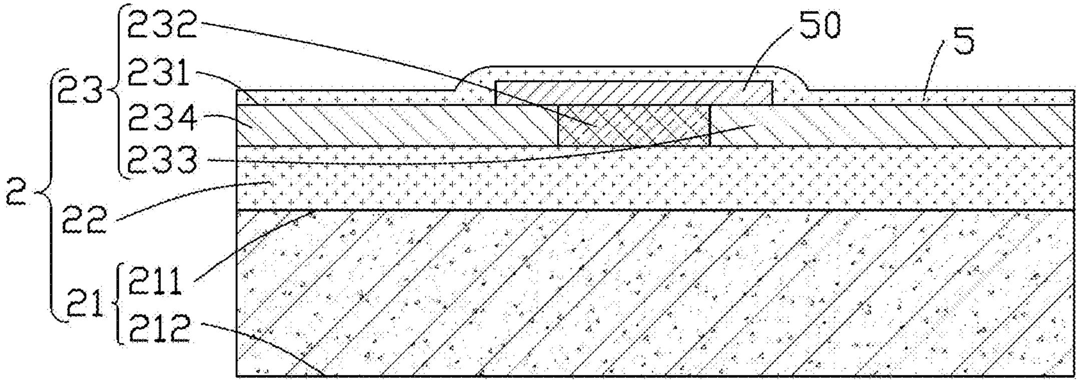

Step S12, as shown in FIG. 15B, a dummy gate 50 is formed on the main surface 211 of the semiconductor layer 23 of the substrate 2. Then, patterns are defined on the dummy gate 50, and the semiconductor layer 23 is doped with ions when using the dummy gate electrode 50 as a mask. Then, the second insulation layer 5 is formed on the substrate 2, and the second insulation layer 5 covers the dummy gate 50.

The dummy gate 50 may be composed of polycrystal silicon. In at least one embodiment, the semiconductor layer 23 is doped with phosphorus ions (N-type doping) to define a P-type channel region 232 located below the dummy gate electrode 50 and two N-type lightly doped regions located on both sides of the channel region 232. A drain region 233 is formed at one of the lightly doped regions, and a source region 234 is formed at another one of the lightly doped regions.

Figure 15C:
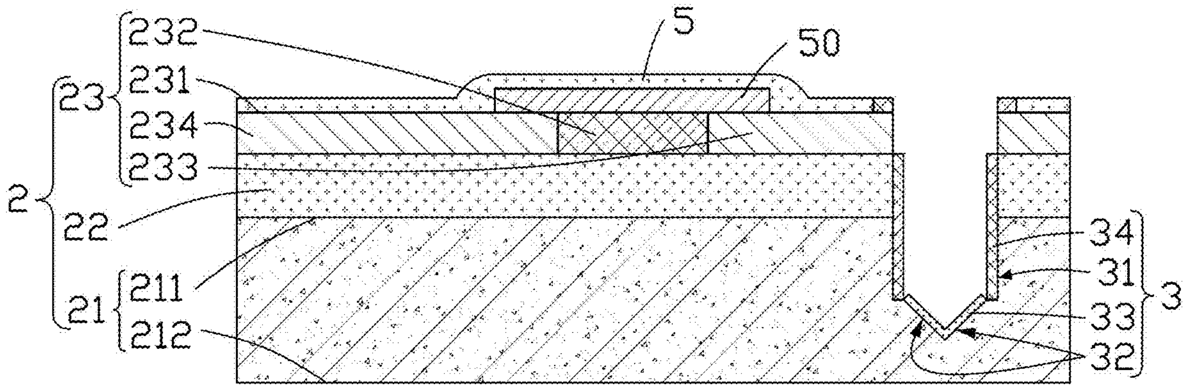

Step S13, as shown in FIG. 15C, the drain region 233 is selectively etched to form the at least one hole 3.

The formation of the hole 3 may be carried out by forming patterns in the second insulation layer 5 that covering the first surface 231 by Electron Beam Lithography (EBL). The second insulation layer 5 is then used as a mask, and the hole 3 is formed in the substrate 2 by Reactive Ion Etching (RIE). A protective layer 34 with a certain thickness is formed on the sidewall 31 and a bottom surface of each hole 3 by Plasma Enhanced Chemical Vapor Deposition (PECVD). The protective layer 34 may include silicon nitride ($SiN_x$). Then, the protective layer 34 on the bottom surface of the hole 3 is etched by Inductively Coupled Plasma (ICP) to expose the (100) crystal plane of the silicon substrate 21. Next, wet etching is performed on the exposed (100) crystal surface of the silicon substrate 21 by an etching solution including potassium hydroxide (KOH), until the bottom surface 32 having the (111) crystal plane is exposed. During the etching process, the protective layer 34 on the sidewall 31 functions as a barrier. At this time, the bottom surface 32 of the hole 3 forms a V-shaped groove. Finally, a drain buffer layer 33 (aluminum nitride) is formed on the bottom surface 32 of the hole 3 by organic metal chemical vapor deposition (MOCVD).

Figure 15D:
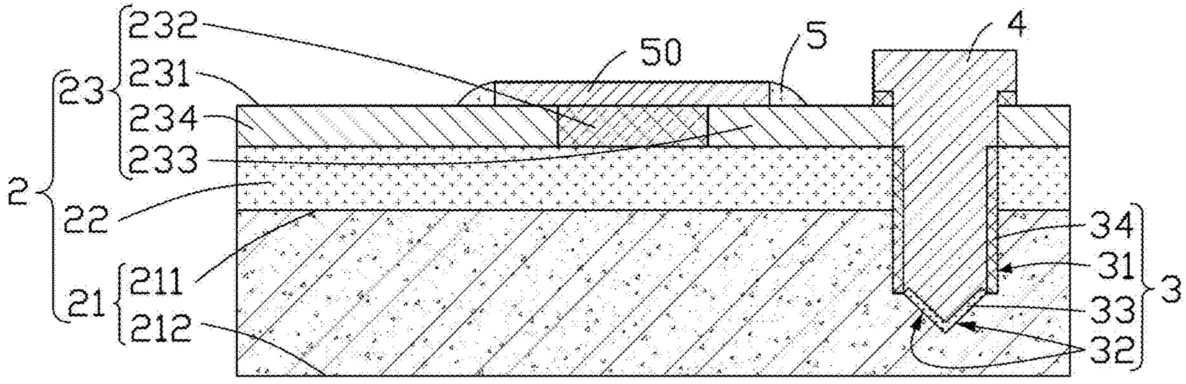

Step S14, as shown in FIG. 15D, a gallium nitride epitaxial layer is formed within the hole 3, and the gallium nitride epitaxial layer is doped with silicon to form the gallium nitride drain electrode 4. Then, the second insulation layer 5 is partially removed, and the remaining second insulation layer 5 surrounds the sidewalls of the dummy gate 50.

In at least one embodiment, a mixed gas including silane ($SiH_4$) and hydrogen is introduced into the gallium nitride epitaxial layer, thereby doping silicon in gallium nitride.

Figure 15E:
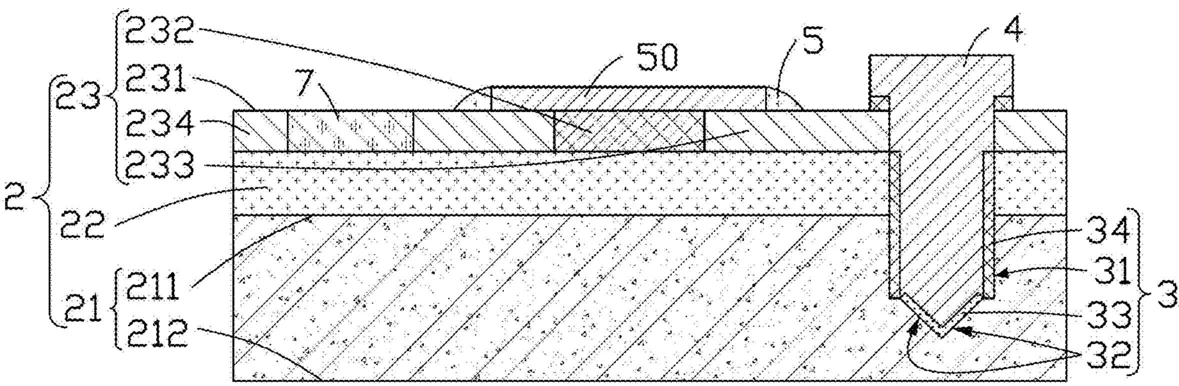

Step S15, as shown in FIG. 15E, a heavily doped region is formed by doping ions in the source region 234, thereby forming the source electrode 7.

In at least one embodiment, the source region 234 is doped with N-type ions of high concentration, such as phosphorus ions. The doped ions generate flow of electrons in the channel region 232.

Figure 15F:
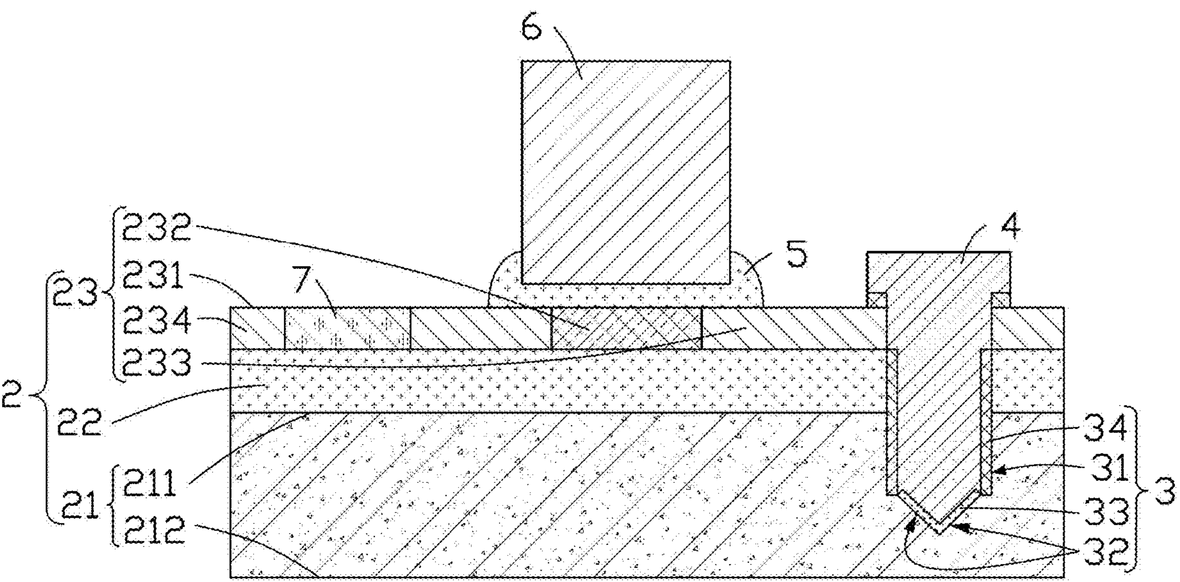

Step S16, as shown in FIG. 15F, the dummy gate electrode 50 is removed by etching, thereby exposing the semiconductor layer 23 below. Another second insulation layer 5 is formed on the exposed semiconductor layer 23. Finally, a gate electrode 6 is formed on the second insulation layer 5 to obtain the silicon-based field effect transistor 20.

The laser device 100 in the present disclosure includes the silicon-based field effect transistor 20 and the nanocrystal array 10. Compared with the planar structure of an existing DBR, the nanorods 1 can release transverse stresses, thereby reducing lattice dislocation and epitaxial defects. Due to the energy required for the doping process for forming the nanorods 1 is reduced, doping ionization and quantum efficiency may be improved. The light extraction direction of the nanorods 1 may also be controlled through the structural design of the nanocrystal array 10. The wavelength and emission direction of the laser may be controlled by adjusting the number of periods of the unit cells A and the optical mode. Thus, the periodically arranged nanorods 1 has advantages in mode control and wavelength adjustability. The structure of the nanorods 1 may also change the photon density around the indium gallium nitride energy well layer 152 (i.e., the indium gallium nitride active layer), causing the photons to surround the indium gallium nitride active layer, thereby increasing the photon density. Moreover, through the Purcell effect in the micro resonant cavity, the radiation lifetime of the photons may be shortened, thereby improving the quantum efficiency inside the nanorods 1. The tunnel junction layer 13 may increase the injected carrier concentration to improve the luminescence efficiency. When two nanorods 1 are included in each unit cell A, the laser threshold is reduced, while the output power is increased. The nanocrystal array 10 may also improve the collimation of the laser beam, reduce the divergence angle and the size of the laser spots, thereby can improving the resolution and the image quality of the display. Moreover, since the nanocrystal array 10 includes the nanorods 1 arranged in an array, DBR is not needed, and the smaller resistance of the nanorods 1 may reduce the power consumption of laser device 100. In addition, the silicon-based field effect transistor 20 is used as the power supply, high-speed signal switching of the laser device 100 may be realized. The nanocrystal array 10 may be connected with other silicon components in series or in parallel to achieve applications in various scenarios.

Figure 18:
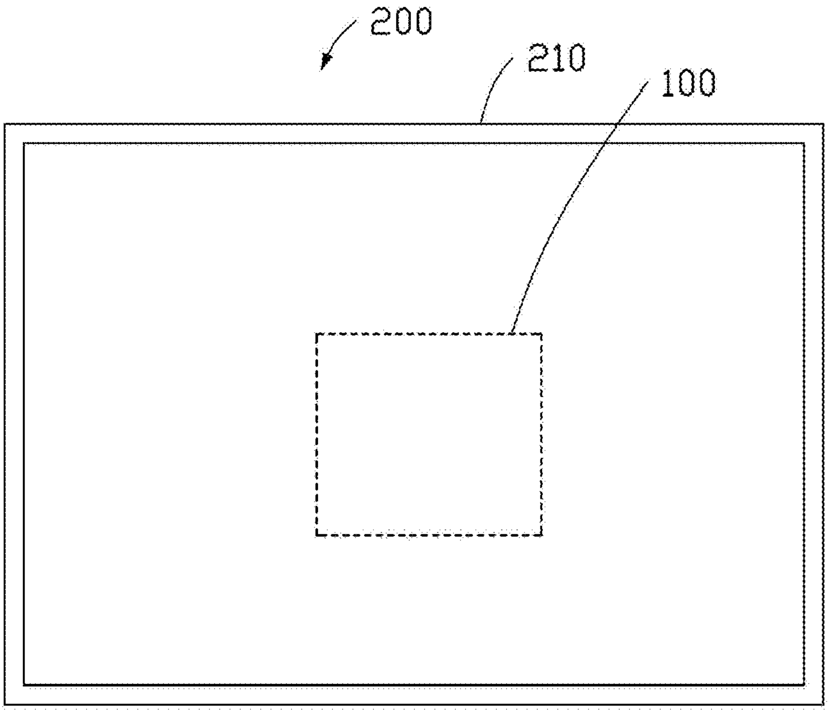
FIG. 18 is a diagrammatic view of a display device according to an embodiment of the present disclosure.

Referring to FIG. 18, a display device 200 is also provided according to an embodiment of the present disclosure. The display device 200 includes a casing 210 and the laser device 100 located inside the casing 210. The display device 200 may be a micro panel or a laser projector. The display device 200 may also be a wearable display device based on Augmented Reality (AR), Virtual Reality (VR), Substitutional Reality (SR), Mixed Reality (MR), or Extended Reality (XR).

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A laser device comprising:

a substrate comprising a first surface and a second surface opposite to the first surface, the first surface being recessed toward the second surface to form at least one hole;

at least one drain electrode formed in the at least one hole;

a nanocrystal array located on each of the at least one drain electrode, the nanocrystal array comprising a plurality of nanorods arranged in an array, each of the plurality of nanorods comprising a nanorod buffer layer, a first type semiconductor layer, a tunnel junction layer, a second type semiconductor layer, a multi-quantum well, and another first type semiconductor layer successively stacked on each other;

a conductive layer located on the nanocrystal array; and an electrode layer located on the conductive layer;

wherein the substrate comprises a silicon substrate, a first insulation layer, and a semiconductor layer successively stacked on each other; the silicon substrate has a main surface with (100) crystal plane, the first insulation layer is located on the main surface, a surface of the semiconductor layer away from the first insulation layer is defined as the first surface, and a surface of the silicon substrate away from the first insulation layer is defined as the second surface; the at least one hole penetrates through the semiconductor layer and extends into the silicon substrate, each of the at least one hole defines a sidewall and a bottom surface connected to the sidewall, the bottom surface is inclined with the silicon substrate, and a (111) crystal plane of the silicon substrate is exposed from the bottom surface.

2. The laser device according to claim 1, further comprising a selective growth layer located on each of the at least one drain electrode, wherein the selective growth layer defines a plurality of through holes, each of the plurality of through holes extends through the selective growth layer, the at least one drain electrode is exposed from the plurality of through holes, and the plurality of nanorods is formed by growing in the plurality of through holes.

3. The laser device according to claim 2, wherein the selective growth layer comprises at least one of silicon dioxide, silicon nitride, titanium dioxide, tungsten, and titanium.

4. The laser device according to claim 1, wherein the electrode layer is a hollow polygonal structure or an annular structure.

5. The laser device according to claim 1, wherein a diameter of each of the at least one hole is in a range of hundreds of nanometers.

6. The laser device according to claim 1, further comprising a protective layer formed on the sidewall and a drain buffer layer formed on the bottom surface, wherein the at least one drain electrode is formed on the protective layer and the drain buffer layer.

7. The laser device according to claim 6, wherein the drain buffer layer comprises aluminum nitride.

8. The laser device according to claim 6, further comprising:

a second insulation layer formed on the first surface and located on one side of the at least one drain electrode;

a third insulation layer located on the first surface and covering each of the second insulation layer and the nanocrystal array;

a gate electrode located on the second insulation layer and exposed from the third insulation layer; and a source electrode located in the semiconductor layer and exposed from the third insulation layer, the gate electrode being between the source electrode and the at least one drain electrode.

9. The laser device according to claim 8, comprising a plurality of the drain electrodes arranged in an array.

10. A display device comprising:

a casing; and a laser device located in the casing, the laser device comprising:

a substrate comprising a first surface and a second surface opposite to the first surface, the first surface being recessed toward the second surface to form at least one hole;

a drain electrode formed in each of the at least one hole;

a nanocrystal array located on the drain electrode, the nanocrystal array comprising a plurality of nanorods arranged in an array, each of the plurality of nanorods comprising a nanorod buffer layer, a first type semiconductor layer, a tunnel junction layer, a second type semiconductor layer, a multi-quantum well, and another first type semiconductor layer successively stacked on each other;

a conductive layer located on the nanocrystal array; and an electrode layer located on the conductive layer;

wherein the substrate comprises a silicon substrate, a first insulation layer, and a semiconductor layer successively stacked on each other; the silicon substrate has a main surface with (100) crystal plane, the first insulation layer is located on the main surface, a surface of the semiconductor layer away from the first insulation layer is defined as the first surface, and a surface of the silicon substrate away from the first insulation layer is defined as the second surface; the at least one hole penetrates through the semiconductor layer and extends into the silicon substrate, each of the at least one hole defines a sidewall and a bottom surface connected to the sidewall, the bottom surface is inclined with the silicon substrate, and a (111) crystal plane of the silicon substrate is exposed from the bottom surface.

11. The display device according to claim 10, wherein the nanocrystal array comprises a plurality of unit cells periodically arranged, and each of the plurality of unit cells comprises at least one of the plurality of nanorods.

12. The display device according to claim 10, wherein the first type semiconductor layer is an N-type gallium nitride layer, the second type semiconductor layer is a P-type gallium nitride layer; the tunnel junction layer comprises an N-type gallium nitride heavily doped layer adjacent to the first type semiconductor layer, a P-type gallium nitride heavily doped layer adjacent to the second type semiconductor layer, and an indium gallium nitride layer located between the N-type gallium nitride heavily doped layer and the P-type gallium nitride heavily doped layer.

13. The display device according to claim 10, wherein the multi-quantum well comprises a plurality of indium gallium nitride energy well layers and a plurality of gallium nitride energy barrier layers, the plurality of indium gallium nitride energy well layers and the plurality of gallium nitride energy barrier layers are alternately stacked on each other, each of the plurality of indium gallium nitride energy well layers is arranged between adjacent ones of the plurality of gallium nitride energy barrier layers.

14. The display device according to claim 10, wherein a cross-section of each of the plurality of nanorods is hexagonal or triangular.

* * * * *